Jan. 24, 1967

P. J. HANSEN 3,300,723

SQUELCH CIRCUIT

Filed Aug. 13, 1963

INVENTOR.
Philip J. Hansen
BY Mueller & Aichele
ATTYS

United States Patent Office 3,300,723

Patented Jan. 24, 1967

3,300,723

SQUELCH CIRCUIT

Philip J. Hansen, Chicago, Ill., assignor to Motorola Inc., Chicago, Ill., a corporation of Illinois Filed Aug. 13, 1963, Ser. No. 301,869
4 Claims. (Cl. 325—348)

Figures 1, 2:
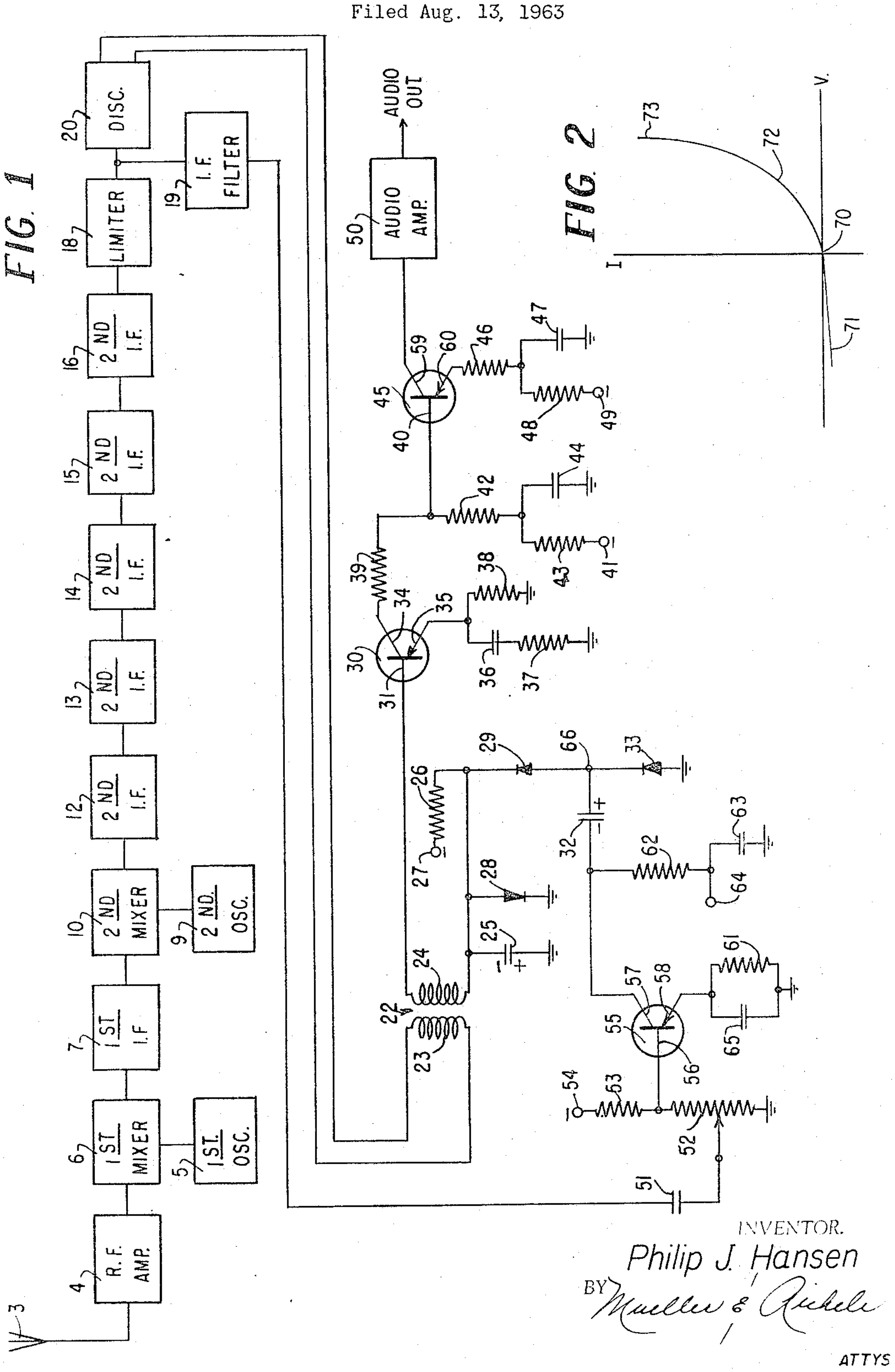

This invention relates to a radio receiver squelch circuit and in particular to the regulation of the squelch voltage applied to interrupt a transistor stage.

The components of a miniature hand-held radio are normally operated at or near their maximum ratings so that the maximum possible sensitivity is obtained. In such case, care must be taken to prevent the application of a voltage of a magnitude which may damage the components.

In the squelch circuit of a receiver the magnitude of the squelch voltage applied to interrupt a stage determines the time necessary for the interrupted stage to recover after the squelch voltage is removed. The application of a squelch voltage of a larger magnitude than necessary to bias off this stage will result in unnecessarily lengthening this recovery period so that the receiver will not respond to a desired signal.

Accordingly, it is an object of this invention to provide means for limiting the squelch voltage applied to a radio receiver stage to prevent damage to the receiver components and to minimize the recovery time.

A feature of this invention is the provision of a diode connected in the circuit to make use of its forward conduction characteristics to limit the squelch voltage applied to an audio amplifier.

The invention is illustrated in the drawings wherein:

FIG. 1 is a partial schematic and partial block diagram of a radio receiver incorporating the invention; and FIG. 2 illustrates the forward conduction properties of the diode used in the invention.

In practicing this invention, a portable radio receiver includes a squelch circuit wherein a squelch voltage is applied to bias off a transistor audio amplifier when no carrier signal is being received. This squelch voltage is of opposite polarity to the normal bias voltage applied to this portion of the stage and as a result certain components in the circuit are subjected to a voltage opposite to their normal polarity. Only a limited reverse voltage can be applied to these components before damage occurs, and this can easily be exceeded by the squelch voltage applied. Accordingly, a diode is connected in the circuit in such a manner as to use its forward conduction characteristics to limit the squelch voltage applied to a transistor amplifier stage without affecting the normal bias applied to this stage. In addition, by limiting the squelch voltage applied to the audio amplifier stage, the time required for this stage to turn on after the squelch voltage has been removed is held to a minimum.

In FIG. 1 a radio receiver of the double superheterodyne type is shown. An antenna 3 receives carrier signals and couples them to RF amplifier 4. The output of RF amplifier 4 and first oscillator 5 are mixed in first mixer 6 to develop an intermediate frequency signal which is amplified in the first IF amplifier 7. The output of the first IF amplifier 7 and second oscillator 9 are mixed in the second mixer 10. The output of second mixer 10 is amplified in a series of IF amplifiers 12, 13, 14, 15 and 16. The output of second IF amplifier 16 is amplified in limiter 18, and its output is coupled to low pass filter 19 and discriminator 20. The audio output from discriminator 20 is coupled to audio amplifier stages including transistors 30 and 45. The output of audio amplifier 45 is further amplified in audio amplifier 50 and applied to subsequent audio circuits.

The output of low pass filter 19 is coupled to the squelch amplifier, including transistor 55, and the output of transistor 55 is applied to transistor 30 to bias this transistor.

Considering the operation of the audio amplifier stages 30 and 45 in more detail, the output of discriminator 20 is coupled to the base 31 of transistor 30 through transformer 22. The secondary 24 of transformer 22 is coupled to the base 31 of transistor 30 and to a reference potential through capacitor 25. Capacitor 25 furnishes a low impedance path for alternating current signals. The emitter 35 of transistor 30 is connected to ground by means of resistor 38 and by means of capacitor 36 in series with resistor 37. Resistor 38 has a relatively high value in order to provide sufficient temperature compensation for this stage. Capacitor 36 furnishes a bypass path for alternating current voltages to minimize the degeneration caused by resistor 38. Resistor 37 has a relatively small value and is used to provide a small amount of degeneration for this stage. The output of transistor 30 is direct current coupled to the base 40 of transistor 45 through the voltage divider consisting of resistors 39 and 42. Capacitor 44 furnishes low impedance path to ground for alternating current signal voltage and together with resistor 43 provides a decoupling network for the power supply. Resistor 46 furnishes degeneration for transistor 45 to provide stability to this stage. A bias voltage for the emitter 60 of transistor 45 is provided by resistors 48 and 46 connected in series to the minus supply voltage at terminal 49. Capacitor 47 provides a low impedance path to ground for alternating current signals to bypass resistor 48. The output of transistor 45 is amplified in audio amplifier 50 and applied to subsequent audio circuits.

A bias voltage for the base 31 of transistor 30 is provided by the voltage divider consisting of resistor 26 and diodes 29 and 33 connected in series between a negative supply voltage, terminal 27 and ground. The forward conduction characteristics of diodes 29 and 33 are used to establish the bias voltage for the base 31 of transistor 30 at a desired level.

Referring to FIG. 2 there is shown a curve of the current through a diode as a function of the voltage applied across the diode. When a voltage is applied across a diode in the reverse direction a very small current will flow through the diode. This is represented by the curve from point 70 to point 71. When voltage is applied across a diode in the forward direction the current flow becomes very large and the diode acts as if it were a very small resistor. This is illustrated by the curve from point 72 to point 73. However, when very low voltages are applied in the forward direction the current through the diode is small and can be considered negligible for many applications. Each diode thus has a threshold voltage level in the forward direction which must be exceeded before the diode can be considered the equivalent of a closed switch. This is illustrated from point 70 to point 72 on the curve. Semiconductor diodes normally exhibit a threshold voltage of from 0.25 volt to 1.0 volt depending upon the type of material used in their manufacture.

Referring again to FIG. 1 the voltage drop across diodes 29 and 33 due to the bias voltage applied from terminal 27 through resistor 26 is equal to twice the voltage drop in forward direction across one diode. This provides a relatively constant level of bias voltage for the base 31 of transistor 30.

The residual AM and low frequency noise appearing at the output of limiter 18 is coupled to the base 56 of transistor 55 through low pass filter 19 and coupling capacitor 51. When a carrier signal is developed by antenna 3 and amplified and detected by the subsequent stages of the receiver preceding limiter 18 the level of residual AM noise appearing at the output of limiter 18 becomes very low. The level of this noise is therefore an indication of the reception of a carrier signal.

The output of low pass filter 19 is coupled to the base 56 of transistor 55, through capacitor 51 and resistor 52. Resistor 52 is a variable resistor and provides an adjustment for the level of squelch desired. Resistors 52 and 53 provide a bias for the base 56 of transistor 55. Resistor 61 coupled to the emitter 58 provides temperature stabilization for transistor 55. Capacitor 65 is a bypass capacitor for the alternating current signal present at emitter 58 to prevent degeneration in this stage. A bias for the collector 57 of transistor 55 is provided from a negative supply voltage at terminal 64 through resistor 62. Capacitor 63 is a decoupling capacitor for the power supply voltage. The output from the squelch amplifier is coupled from collector 57 to the junction 66 of diodes 29 and 33 by means of capacitor 32.

Because of the high emitter resistor 38 used for transistor 30 it is necessary to provide a high squelch voltage to the base 31 of transistor 30 in order to assure cut off of this transistor when no carrier signal is received. To produce this high squelch voltage a conventional voltage doubler circuit consisting of capacitors 25 and 32 and diodes 29 and 33 is used. When a positive going signal is present at the base 56 of transistor 55, this transistor is cut off and the voltage appearing at the collector 57 reaches its maximum negative value, capacitor 32 is charged with polarities as indicated in FIG. 1. When the signal applied to the base 56 of transistor 55 is negative going, transistor 55 is biased to conduction and the current flow through the collector circuit and resistor 62 causes the voltage appearing at the collector 57 to rise due to the voltage drop through resistor 62. The voltage across capacitor 32 cannot change instantaneously and therefore the rise in voltage at the collector 57 is added to the voltage rise through capacitor 32 to provide a voltage rise at point 66 equal to approximately twice the voltage rise at collector 57. This voltage is of the correct polarity to bias diode 29 in the forward direction and to charge capacitor 25 to a positive voltage with respect to ground. This positive voltage is applied through the secondary 24 of transformer 22 to the base 31 of transistor 30 biasing this transistor so that it is cut off.

Because of the relatively low input impedance of transistors, it is necessary to use components in the associated circuitry which have low impedances. Capacitor 25 being a bypass capacitor must have relatively high capacitance to work properly in this circuit. In order to provide a capacitor having a high capacitance and a small size for use in miniature circuitry it is necessary to use capacitors of a type having a very limited reverse voltage breakdown rating. With the squelch circuit described above, a voltage can be developed which will exceed the reverse voltage breakdown rating of capacitor 25 thus damaging the capacitor. To prevent this damage and to limit the squelch voltage applied to the capacitor, a diode 28 is connected across the capacitor. This diode is poled so that the squelch voltage will bias it in the forward direction. The voltage developed across diode 28 is thus limited to the forward threshold voltage which is inherent in a diode. The normal bias voltage applied to the base 31 of transistor 30 is of reverse polarity and thus will not be affected by the insertion of diode 28 in the circuit. In addition to preventing the destruction of components by the application of too large a voltage thereto, diode 28 will prevent capacitor 25 from charging to an excessively high voltage. The recovery time of the amplifier circuit is determined by the time necessary for capacitor 25 to discharge to a voltage level at which transistor 30 will again be biased in a forward direction, after the squelch voltage is removed. The greater the voltage applied to capacitor 25, the greater will be the charge on this capacitor and the longer the recovery time will be. By limiting the voltage applied to capacitor 25 the recovery time is kept to a minimum.

The invention therefore provides a simple circuit and method for limiting the magnitude of a squelch voltage applied to an amplifier stage by using the forward conduction characteristics inherent in a diode. By limiting the squelch voltage the recovery time of the amplifier is kept to a minimum and damage to circuit components is prevented.

What is claimed is:

1. A squelch circuit for use in a carrier wave receiver including a first portion for receiving and translating a carrier wave signal, and an amplifier having an input circuit coupled to said first portion and adapted to be interrupted by the application of a squelch potential thereto, said squelch circuit including in combination, means coupled to said first portion for generation of a squelch potential in the absence of a carrier wave signal, capacitor means having a first terminal coupled to said amplifier input and a second terminal coupled to a reference potential, circuit means coupling said generating means to said first terminal for applying said squelch potential to said amplifying means to interrupt the same, whereby said squelch potential is impressed across said capacitor means, a diode connected across said capacitor means and poled to limit the magnitude of the squelch potential applied to said capacitor by means of the forward conduction characteristics of said diode.

2. In a carrier wave receiver including a first portion for receiving and translating a carrier wave signal, means coupled to said first portion for the generation of a squelch potential in the absence of a carrier wave signal in said first portion, and an amplifier having an input circuit coupled to said first portion and adapted to be interrupted by the application of a squelch potential thereto, the combination including transformer means coupled to said first portion and having a secondary with first and second terminals, means coupling said first terminal to the input circuit of said amplifier for applying a signal thereto, a capacitor connected between said second terminal and a reference potential, bias supply means for said amplifier including resistance means connected between potential supply means and said second terminal, means coupling said generating means to said second terminal for applying said squelch potential to said amplifier to interrupt the same whereby said squelch potential is impressed across said capacitor, a diode connected across said capacitor and poled to limit the magnitude of the squelch potential applied to said capacitor by means of the forward conduction characteristics of said diode.

3. A carrier wave receiver including in combination, a first portion for receiving and translating a carrier wave signal, and a transistor amplifier having an input circuit coupled to said first portion and adapted to be interrupted by the application of squelch potential thereto, means coupled to said first portion for generating a squelch potential in the absence of a carrier wave signal in said first portion, capacitor means having a first terminal coupled to said amplifier input and a second terminal coupled to a reference potential, circuit means coupling said generating means to said first terminal for applying said squelch potential across said capacitor means to interrupt said amplifier means, said capacitor means being charged by said squelch potential and holding said amplifier means interrupted until said capacitor means discharges, a diode connected across said capacitor means and poled to limit the magnitude of said squelch potential applied to said capacitor by means of the forward conduction characteristics of said diode, thereby decreasing the time required for said capacitor to disccharge upon removal of the squelch potential so that said amplifier means becomes operative.

4. A carrier wave receiver including in combination, a first portion for receiving and translating a carrier wave signal, a transistor amplifier having input and output electrodes and adapted to be interrupted by the application of a squelch potential thereto, transformer means having a primary winding coupled to said first portion and a secondary winding having a first terminal coupled to said input electrodes and a second terminal, first capacitance means coupled between said second terminal and a reference potential, bias potential supply means for said transistor amplifier including resistance means connected between a potential supply and said second terminal, means coupled to said first portion for the generation of a squelch potential in the absence of a carrier wave signal in said first portion, first and second diode means series connected between said second terminal and said reference potential and poled to be biased in the forward direction by said bias potential, second capacitance means coupling said generating means to the junction of said first and second diodes, third diode means connected across said first capacitance and poled to limit the magnitude of said squelch potential applied to said first capacitance means by means of the forward conduction characteristics of said diode.

No references cited.

WILLIAM C. COOPER, *Acting Primary Examiner.*

R. LINN, *Assistant Examiner.*